Figure 1:
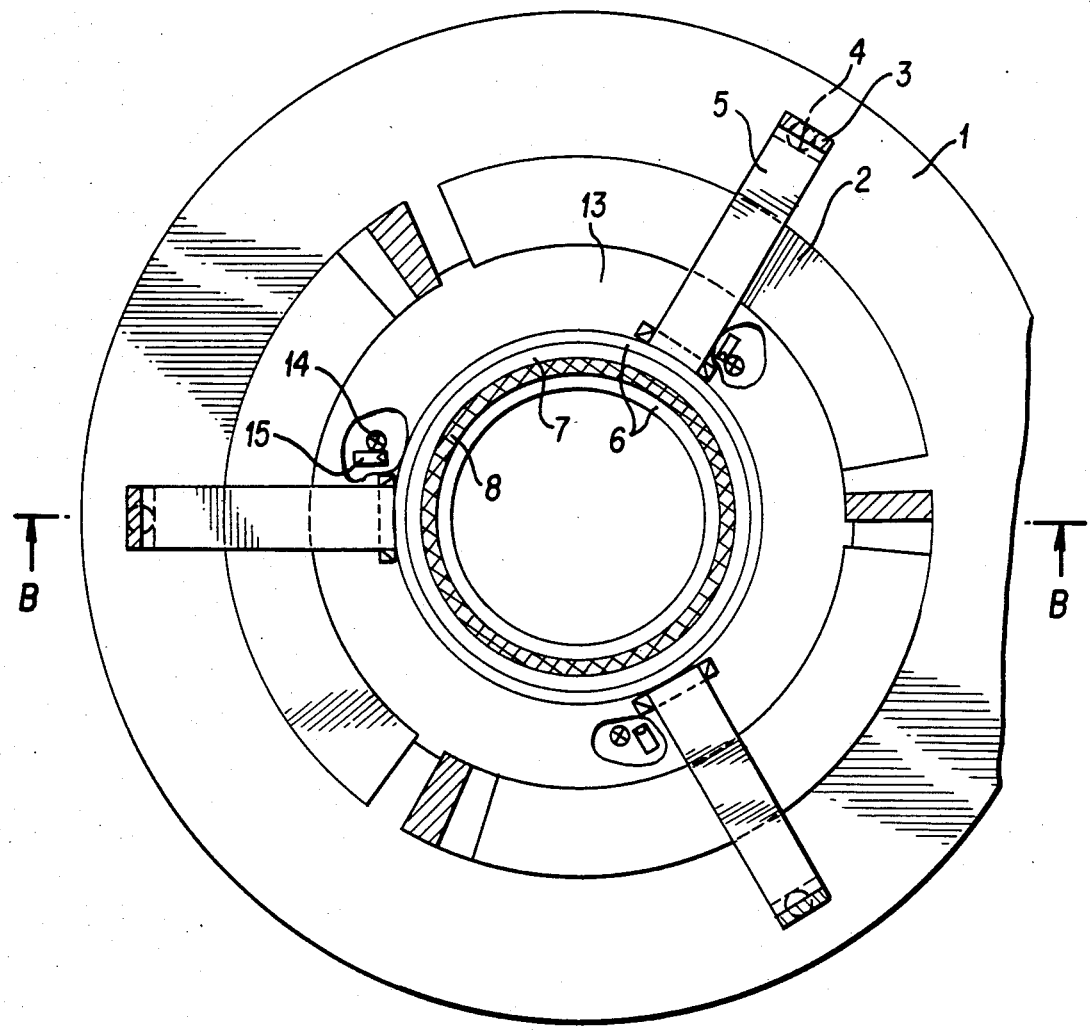

United States Patent [19]

Furchert

[11] Patent Number: 4,656,408

[45] Date of Patent: Apr. 7, 1987

[54] XY-SURFACE DRIVE HAVING LIMITED φ-ROTATION AND Z-MOVEMENT

[75] Inventor: Hans-Juergen Furchert, Ilmenau, German Democratic Rep.

[73] Assignee: Jenoptik Jena GmbH, Jena, German Democratic Rep.

[21] Appl. No.: 673,957

[22] Filed: Nov. 21, 1984

[30] Foreign Application Priority Data

Nov. 30, 1983 [DD] German Democratic Rep. .................................... 2573036

[51] Int. Cl.$^4$ ................................................ G05B 1/06
[52] U.S. Cl. ..................................... 318/653; 318/640; 318/687
[58] Field of Search ............... 318/653, 687, 640, 135

[56] References Cited

U.S. PATENT DOCUMENTS

| | | | |
|---|---|---|---|
| 3,745,433 | 7/1973 | Kelby et al. | 318/115 |
| 4,485,339 | 11/1984 | Trost | 318/653 X |
| 4,506,204 | 3/1985 | Galburt | 318/653 |
| 4,506,205 | 3/1985 | Trost et al. | 318/653 |
| 4,507,597 | 3/1985 | Trost | 318/653 |

FOREIGN PATENT DOCUMENTS 215645 11/1984 German Democratic Rep. .

Primary Examiner—Benjamin Dobeck
Attorney, Agent, or Firm—Jordan and Hamburg

[57] ABSTRACT

An xy-surface drive of limited φ-rotation and z-movement, has three box coils, positioned at mutual angles of 120°, the coils being mechanically connected to each other, and guided in the working air-gap of the magnet ring segment system such that when current flows through the coils, there a power or momentum results, which moves and/or rotates the coil arrangement which, by means of an electrodynamic system, is deflectably connected in z-direction to the object support only via a plate spring. The coil arrangement is connected to an incremental x-y-φ-measured value indicator, so that a position control connects the coils according to the deviation to the voltage sources of various polarity, so that the ideal position is attained. The z-position is optimized via an analyzer of object sharpness and a position control.

3 Claims, 2 Drawing Figures

XY-SURFACE DRIVE HAVING LIMITED φ-ROTATION AND Z-MOVEMENT

FIELD OF APPLICATION OF THE INVENTION

The invention relates to a xy-surface drive having limited $\phi$-rotation and z-movement, especially for fast and accurate x-y-$\phi$-z positioning of spatial and surface-like objects in instrument and automation engineering for the recognition or variation of the location structure. Such drives are especially suitable for the connection of electronic systems producing digital signals.

CHARACTERISTICS OF THE STATE OF ART

It is known that using cross tables with conventional motor-operated individual drives, as well as by using motion transformers, xy-movements are produced and that a $\phi$-rotation may be realized, also in stages, with a further table plate separately driven by means of a motion transformer and mechanically supported on or in the cross table plate moved in xy-direction. These solutions require great mechanical guidance efforts and are therefore subjected to multiplanar wear, whereby their great mass hinders good dynamics.

According to patent publication DD No. 146 525, the xy-movement in a plane without motion transformers can also be realized by specific coil configurations. The object thereby is to avoid or compensate for interfering rotary motions. In addition, it has also already been proposed to realize the xy-movement in first and second planes without motion transformers with the object of avoiding or compensating for the interfering rotary motion by means of specific coil and magnet configurations.

In a further proposal, in DD-P 205 330 a xy$\phi$-surface motor with circular flat-coil segments has been described. This drive, however, requires a large number of coils and has large dimensions for small xy-movements, thus requiring great control and production costs.

According to a different solution, a drive apparatus of three freedoms using the principle of the moving field motor has been described which, for sufficient performance for high dynamics, requires large dimensions for the exciter coil. Movements in a horizontal z-axis, combined with limited $\phi$-rotation without xy-movement is described in the U.S. Pat. No. 3,745,433 for a cylindrical, mechanical supported component. Such movements are also described using the reluctance principle, for instance, in DD-WP No. 134,900, wherein the attainable interval is sufficient only for rough resolution because of the production possibilities of the tooth structures up to 10 $\mu$m.

OBJECT OF THE INVENTION

The object of the invention is to provide a xy-surface drive of limited $\phi$-rotation and z-movement, which allows the realization of defined x-y-$\phi$-movements without motion transformers and transmission elements, as well as without mechanical xy$\phi$-guidance in a plane and z-movements of mechanical guidance up to a few millimeters in an orthogonal direction thereof, also of smallest intervals, by incremental regulated functioning under 1 $\mu$m and smallest angle of rotation under 10" in the range of the rotation angle up to 100° at low mechanical production, coil and control costs, as well as great effective coil length and small planar dimension per xy$\phi$-movement plane.

DESCRIPTION OF THE NATURE OF THE INVENTION

According to the invention, three box coils preferably at an angle of approximately 120°, of a minimum length of the movement path, magnet width and safety distance are fastened like spokes between a center ferromagnetic U-profile ring and a larger non-ferromagnetic ringshaped component. Each individual coil section passes through a working air-gap of a three-part magnetic ring segment system. An object support component, which is positioned centrally thereof, and which allows beams to pass through it, has a ring coil fastened on it, and is guided by means of a plate spring in the air-gap of a magnet ring segment system, is firmly connected to the drive coils, and can be deflected in the z-direction. The xy$\phi$-movable component is guided by three gliding feet, for instance, made of PTFE (polytetrafluoroethylene), on gliding surfaces of the base plate. The mounting with the graticule of the optoelectronic measuring system is fastened on the ferromagnetic U-profile ring. The graticule is irradiated by the irradiation sources and scanned by optoelectronic discrete line receivers, for instance CCD-lines (Charge Coupled Device lines).

The system segments of the magnet ring can advantageously be double systems for the double utilization of the coils. In order to extend the positioning of the object, according to the invention, the xy$\phi$z-moving plane can be evaluated via an optical system, wherein by means of a rotatable optical component, for instance, an inverting Dove prism, an image rotation about a fixed optical axis is realized, and thereby a xyz$\phi_1\phi_2$-positioning is made possible. Furthermore, it is advantageous that the image of the graticule is magnified on the CCD-line by an image formation apparatus, in order to increase the resolution of the system.

In order to achieve a certain ideal position in x, y, $\phi$, the corresponding digital control signals are supplied to the positioning control, which compares them with the digital location signals of the optoelectric measuring system, for instance, as described in DD-WP No. 146,525 for an x, y-movement, and depending upon the existing deviation, connects the assigned coils to existing voltage sources of the required polarity and voltage of equivalent pulse amplitude ratio. The position information of the measuring system is derived via a microcomputer or signal processor and can also be evaluated via a control of a microcomputer. According to the invention, for the shift of the z-coordinates, the signals of an object sharpness analyzer are evaluated by a control according the the deviation from the possible optimum and are steered towards the optimum position, or a single coordinate measuring system is integrated, in order to be able to return again to the default positions according to the functioning at the xy$\phi$-movement. Except in the zero position of the loaded plate spring, the attained z-position has to be assured by producing a holding power of the electrodynamic drive system.

EXEMPLIFIED EMBODIMENT

Figure 2:
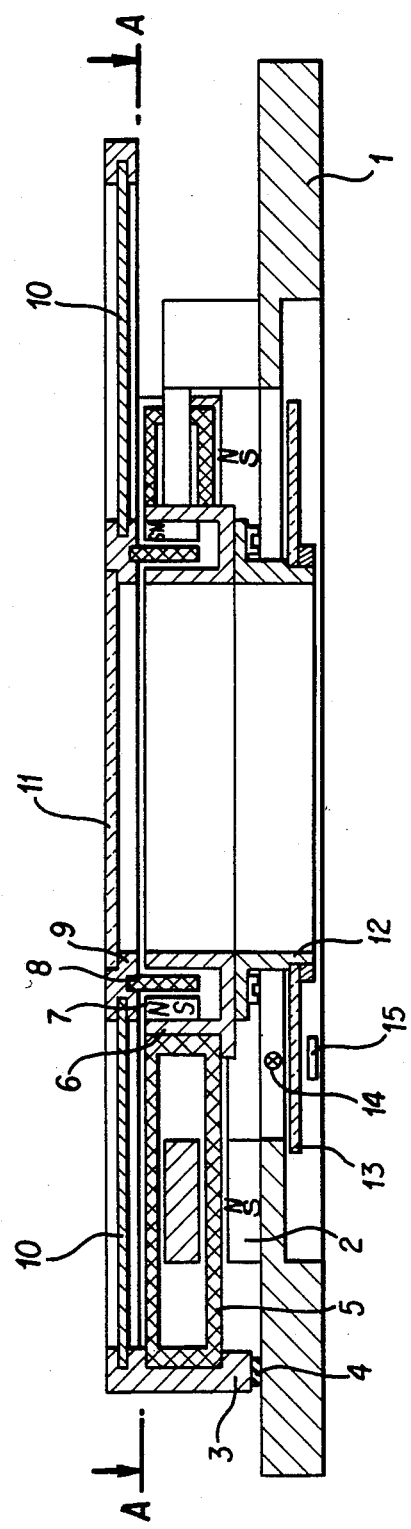

The invention is hereafter further explained by means of exemplified embodiments. The enclosed drawings show the following:

FIG. 1: Principal solution of a xy-surface drive of limited $\phi$-rotation and z-movement along section A—A of FIG. 2 in accordance with the invention;

FIG. 2: Section B—B of FIG. 1.

Referring now to the drawings, three magnet ring system segments 2, preferably separate by angles of approximately 120°, are fastened on a ferromagnetic base plate 1. An element 3, movable in $xy\phi$-direction on three gliding feet 4, made for example of PTFE, is guided on the ferromagnetic base plate 1. The $xy\phi$-movable element 3 is fixedly connected to a central ferromagnetic U-profile ring 6 via three box coils 5 positioned like spokes, preferably at an angle of approximately 120°, whereby each section of the coil phase windings of the box coils 5 passes with its coil axis in horizontal plane through the working air-gaps of the three evenly polarized magnet ring system segments 2. On the center of ferromagnetic U-profile ring 6 is fastened a magnet ring 7, and a ring coil 8 is held in the thereby resulting working air-gap of the magnet system by a plate spring 10, fastened on a mounting 9 of the object support. The plate spring 10 is fixedly clamped in the $xy\phi$-movable component 3 and the mounting 9 of the object support. The mounting 9 of the object support, in which an object support plate 11 which allows beams to pass through it, can be deflected in $\pm$ z-direction by applying an electrical voltage of corresponding magnitude and flow-direction of the current to the ring coil 8. On the ferromagnetic U-profile ring 6 is furthermore fastened a mounting 12 with a graticule 13 of the optoelectronic measuring system, the graticule being irradiated by the beam sources 14 and scanned by the CCD-lines 15.

The magnet ring system segments 2 can alternatively double systems of two working air gaps for the double utilization of the coils.

In order to extend the possibilities of object positioning, the object can be evaluated on the $xy\phi z$-moving surface via an optical system, where by means of a rotatable optical component, for instance an inverting Dove prism, it is possible to realize an image rotation about a fixed optical axis, which thus allows a $xyz\phi_1\phi_2$-positioning.

The image of graticule of the measuring system 13 can be enlarged on the CCD-lines 15 by an optical image formation apparatus, in order to increase the resolution of the system.

In order to achieve a specific ideal position in x, y, $\phi$, a location control (not illustrated) is supplied with corresponding control signals, which the position control compares to the digital position signals of the optoelectronic measuring system 14, 15, and according to the deviation, connects the assigned coils to the existing voltage sources of the required polarity and to the potential of equivalent pulse amplitude ratio. The position information of the measuring system 14, 15 is then derived via a microcomputer or signal processor and can also be evaluated via a control of a microcomputer.

For the shift of the z-coordinates, the signals of an analyzer of object sharpness are evaluated according to the deviation from the possible optimum via a position control, and are steered towards the optimum position, or a single coordinate measuring system having only a small measurement range has to be integrated, so that default positions can later be attained again according to the functioning at the $xy\phi$-movement. Except in the charge-dependent zero location of the plate spring, the z-position attained has to be assured by the production of an adhesive power of the electrodynamic drive system 7, 8.

I claim:

1. In an xy-surface drive having limited $\phi$-rotation and z-movement, comprising a magnet system positioned on a base plate, mechanically connected coils mounted to pass through the working-airgaps of the magnet system, graticule means being fastened on the coils, and mechanical guidance means for the movement are fastened on the base plate and connected to a deflectable object support plate guided in z-direction, the improvement wherein three box coils are mounted to extend radially between and affixed to a central ferromagnetic U-profile ring and a larger diameter non-ferromagnetic ringshaped element, each said coil passing through the working air-gap of a separate segment of a three-part magnet ring segment system of magnets extending circumferentially, the ringshaped element supporting therein a plate spring which is fixedly connected at its inner edge to object support means which partially allows beams to pass therethrough, a ring-shaped coil being affixed to the plate spring and extending into a working air-gap of a magnet system defined by a magnet ring affixed to one arm of the U-profile ring and the other arm of the central ferromagnetic U-profile ring.

2. Xy-surface drive according to claim 1, wherein the magnet ring segment system is doubly superimposed for the double utilization of the power-effective coil phase windings.

3. Xy-surface drive for limited $\phi$-rotation and z-movement according to claim 1 wherein the graticule means is enlarged on the CCD-lines of an optical apparatus.

* * * * *